US006614816B2

(12) United States Patent
Gevorgian et al.

(10) Patent No.: US 6,614,816 B2
(45) Date of Patent: Sep. 2, 2003

(54) OPTICAL ELECTROMAGNETIC WAVE GENERATOR

(75) Inventors: Spartak Gevorgian, Göteborg (SE); Nils Calander, Göteborg (SE); Mats Karlsson, Mölndal (SE); Mattias Nilsson, Västra Frölunda (SE); Joakim Een, Göteborg (SE); Anders Larsson, Billdal (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/758,041

(22) Filed: Jan. 11, 2001

(65) Prior Publication Data

US 2001/0014106 A1 Aug. 16, 2001

(30) Foreign Application Priority Data

Jan. 11, 2000 (SE) ................................ 0000048

(51) Int. Cl.[7] ............................ H01S 3/098; H01S 3/10
(52) U.S. Cl. ........................... 372/18; 372/19; 372/20; 372/28; 372/97; 372/29.023; 372/32
(58) Field of Search .............................. 372/18, 28, 32, 372/29.023, 44, 20, 19, 97

(56) References Cited

U.S. PATENT DOCUMENTS

| | | | | |
|---|---|---|---|---|
| 3,950,100 A | * | 4/1976 | Keene et al. | 356/28 |
| 4,635,246 A | * | 1/1987 | Taylor et al. | 359/124 |
| 4,930,133 A | * | 5/1990 | Babbitt et al. | 372/18 |
| 5,687,261 A | * | 11/1997 | Logan | 359/189 |
| 6,078,390 A | * | 6/2000 | Bengtsson | 250/252.1 |

OTHER PUBLICATIONS

*IEEE Transactions on Microwave Theory and Techniques*, vol. 47, No. 7, Jul. 1999, Charles Laperle et al., "Frequency Multiplication of Microwave Signals by Sideband Optical Injection Locking Using a Monolithic Dual–Wavelength DFB Laser Device".

*IEEE Proceedings—J*, vol. 139, No. 4, Aug. 1992, L. Goldberg, "Generation and control of microwave signals by optical techniques".

*IEEE Journal of Quantum Electronics*, vol. 33, No. 6, Jun. 1997, Jérôme Genest et al., "Microwave Signals Generated by Optical Heterodyne Between Injection–Locked Semiconductor Lasers".

*IEEE Journal of Selected Topics in Quantum Electronics*, vol. 3, No. 3, Apr. 1997, P. Dowd et al., "Linewidth Narrowed Vertical–Cavity Surface–Emitting Lasers for Millimeter–Wave Generation by Optical Heterodyning".

* cited by examiner

*Primary Examiner*—Eddie Lee
*Assistant Examiner*—Matthew C. Landau
(74) *Attorney, Agent, or Firm*—Nixon & Vanderhye P.C.

(57) ABSTRACT

Microwaves are generated by heterodyning the outputs of two or more optical lasers which have differing central frequencies to produce beat frequencies in the microwave range. One of the beat frequencies is used to modulate the output of at least one of the lasers so as to produce sidebands which differ from the central frequency by an integral number of the sideband frequency. Each laser is connected to one of the other lasers by a weak optical link to optically injection lock the laser to the sideband of the other laser.

19 Claims, 3 Drawing Sheets

OPTICAL ELECTROMAGNETIC WAVE GENERATOR

TECHNICAL FIELD

The invention relates to the generation of frequency tunable electromagnetic signals using optical lasers, in particular but not exclusively to the production of microwave signals.

BACKGROUND

U.S. Pat. No. 4,907,234 discloses a laser diode construction for microwave production. The device involves two slave lasers injection locked to a master laser. The master laser is subject to microwave modulation to produce sidebands to the central frequency. The slave lasers are injection locked to different sidebands of the master laser. The outputs of the slave lasers are then heterodyned to produce a microwave output. The device requires an external source of microwaves.

U.S. Pat. No. 4,930,133 discloses a laser diode construction for microwave production. The outputs of two lasers are fed into an external resonant cavity and then fed back into the lasers to effect injection locking to different resonant modes of the cavity. The outputs of the two lasers are then heterodyned to produce a microwave output. The device requires the presence of an external resonator.

In "Linewidth Narrowed Vertical-Cavity Surface-Emitting Lasers for Millimeter-Wave Generation by Optical Heterodyning" P. Dowd et. al. Journal of selected topics in Quantum Electronics, Vol. 3, No. 2, April 1997, a device is described using two lasers and heterodyning their outputs. The lasers involve the use of an external fiber-loop mirror as an external cavity for the lasers. Such a fiber-loop mirror is expensive.

The invention solves the problem of providing a microwave generator which does not require an external reference signal and does require expensive components.

SUMMARY OF THE INVENTION

An electromagnetic signal is produced by heterodyning the outputs of two or more optical lasers. A beat frequency signal produced by the heterodyning is fed back into the inputs of the lasers to produce sidebands in the optical output. The each laser is then optically injection-locked to a sideband of the other laser so that the lasers differ in frequency by an amount equal to the beat frequency. The beat frequency may be varied by varying the input bias to one or more of the lasers.

BRIEF DESCRIPTION OF THE DRAWINGS

The invention will now be described in more detail for explanatory, and in no sense limiting, purposes, with reference to the following drawings, in which.

DETAILED DESCRIPTION

Figure 1:
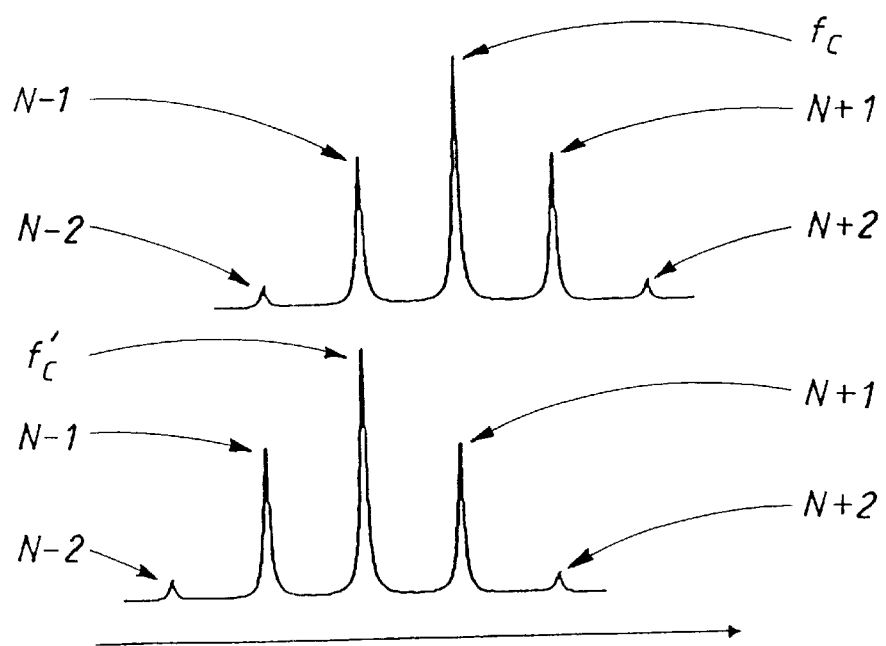
FIG. 1 shows schematically the relationship between power and frequency for a laser that has been modulated by a signal.

FIG. 1 shows schematically the relationship between power and frequency for each of two tunable lasers whose output determining parameter, in this example the DC bias current, has been modulated by a signal, such as a microwave signal. Alternatively, only one of the lasers may be tunable. When not modulated, the lasers each produce a single central frequency $f_C$. When the bias current of the laser is modulated by a signal a number of sidebands are produced normally of decreasing power for increasing harmonic number. Harmonics are produced above and below the central frequency $f_C$ ... N−2, N−1, N+1, N+2 ... , N being an integer. In the figure, two of these harmonics on each side of the central frequency are illustrated. The difference in frequency between each neighbouring pair of harmonics is equal to the frequency of the modulating signal $f_M$.

Figure 2:
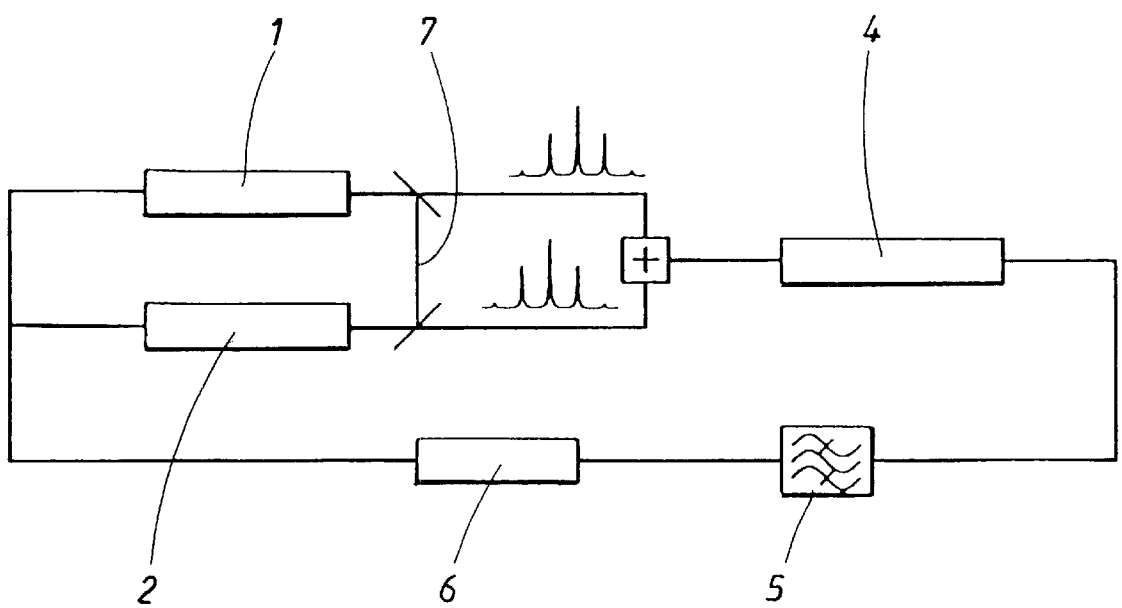
FIG. 2 shows a first example embodiment of the invention in schematic form.

FIG. 2 shows a first example embodiment of the invention in schematic form. First and second lasers 1, 2 are shown arranged in parallel, each of the lasers produces an optical output. Any suitable type of laser may used. Particularly suitable are lasers whose frequency is governed by a controllable parameter, more particularly the parameter may be a voltage or current, for example a bias current. Also, the laser should be capable of injection locking. Suitable lasers should preferably be capable of integration, have a narrow linewidth and/or have a single stable polarisation state. In the present instance a particularly suitable laser is a Vertical Cavity Surface Emitting Laser (VCSEL).

The outputs of the first and second lasers 1, 2 are combined and fed into a photodetector 4. In addition to the central frequencies $f_C$, $f'_C$ beat frequencies will be produced which are equal to any differences in the frequencies of the output signals of the first and second lasers 1, 2, in particular differences in the central frequencies $f_C$, $f'_C$ of the two lasers.

The DC biases of the first and second lasers are different so that they do not have the same central frequency. Since each of the two lasers has a different central frequency there will be heterodyning between the central frequencies when the output signals are combined. The beat frequency produced by the heterodyning equals the difference in the central frequencies $f_C$, $f'_C$. The output from the photodetector 4 is fed via a pass-band filter 5, which filters out the other harmonics of beat frequencies which are not desired, to a delay circuit 6. The delay circuit 6 introduces a variable delay into the microwave feedback signal. The delay circuit 6 thus allows the phase of the feedback signal to be adjusted so that phase noise at the microwave output is reduced. The microwave feedback signal is combined with the DC bias to the lasers to modulate the laser bias and produce the sidebands in each laser output. The DC bias thus has a modulating frequency which is the same as the difference in the central frequencies. The effect of modulating using the difference in the central frequencies is to produce sidebands in the output of each laser which differ from the central frequency by an amount equal to an integral number of the beat frequency of the central frequencies. This means that there is a sideband from each laser that is equal to the central frequency of the other laser. This is illustrated in FIG. 1 where the sidebands of each laser are illustrated. The central frequency of one laser is the same as a sideband of the other laser.

The optical output of each laser is connected to the other laser by means of a weak optical link 7, i.e. at a reduced optical power. The sidebands of the first laser 1 include a sideband at a frequency which is equal to the central frequency $f'_C$ of the second laser 2, so that the second laser 2 can be optically injection-locked to this sideband of the first laser 1. Likewise, the sidebands of the second laser 2, include a sideband at a frequency which is equal to the central frequency $f_C$ of the first laser so that the first laser can be injection-locked to this sideband of the second laser 2. In this way each laser acts as a slave to the other laser. One effect of the optical injection-locking is to narrow the linewidths of the respective central frequencies. This also narrows the line width of the microwave beat frequency. Furthermore, phase noise is reduced.

Figure 3:
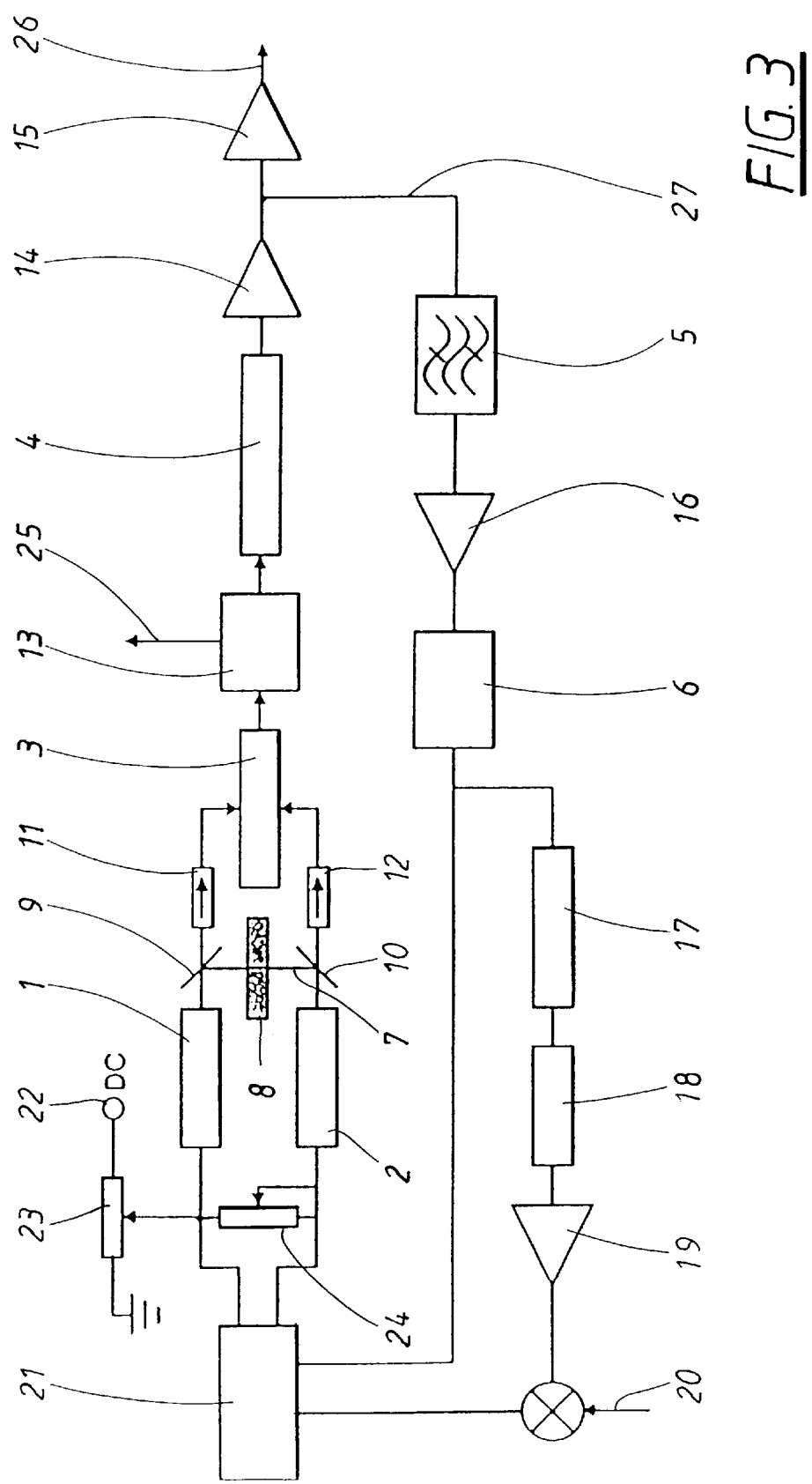
FIG. 3 shows the example embodiment of FIG. 2 in more detail.

FIG. 3 shows the above mentioned embodiment of the invention in more detail. The first and second lasers 1, 2, are shown with their outputs arranged in parallel.

The difference in the DC biases may, as in the present embodiment, be effected by providing a variable resistance 24 in the electrical input to the second laser 2. Since the presence of the resistance 24 reduces the current at the second laser, this laser will have a different central frequency $f'_C$ to the central frequency $f_C$ of the first laser. The difference in the central frequencies $f_C$, $f'_C$ will depend upon the value of the resistance 24 and hence is varied by varying this resistance. Other means of achieving a different DC bias at the second laser may also be used. Alternatively, other means, e.g. temperature, for varying the laser central frequency may equally be used.

The output of each laser is passed through a respective optical isolator 11, 12 to avoid unwanted back reflections. The isolators are arranged after the weak optical link 7. The laser outputs are brought together in a combiner 3. The output of the combiner 3 is passed into a power divider 13. The power divider divides its input into two or more outputs. The outputs may be of equal or unequal power. The power divider 13 allows an optical output 25 which may, for example, be coupled to an optical fibre. The power divider is not however essential to the functioning of the microwave generator. The power divider may take any suitable form which allows part of the optical signal to be divided out. Suitable forms of optical dividers include, for example, a beam splitter.

The optical signal from the lasers is converted into an microwave signal by the photodetector 4. The photodetector may be any suitable high speed device capable of working at microwave frequencies, suitable photodetectors should have high efficiency, high sensitivity and low noise level characteristics. Suitable photodetectors include Schottkey barrier diodes, photoconductors etc. The photodetector 4 reacts to the combined optical signal to produce signals in the microwave range. The signal from the photodetector 4 is amplified by an amplifier 14, which, for example, could be a linear amplifier. The amplified microwave signal is then fed into a power amplifier 15 to provide a microwave output 26 for further use.

Part of the microwave signal from the photodetector 4 is fed back via the line 27 to the biasing current of the lasers. The signal passes first through a narrow band pass filter 5 which allows only the desired beat frequency to pass and eliminates other frequencies. If desired, the band pass filter could allow more than one beat frequency to pass. The signal passes via an amplifier 16 to the delay circuit 6 which functions as already explained above.

From the delay circuit 6 the signal is fed to the DC bias currents of the first and second lasers via a matching circuit 21. The matching circuit 21 matches the impedance of the output of the amplifier 16 with the impedance of the input of the lasers and the DC power supply.

Injection locking of the lasers is achieved by feeding part of the output signal from each laser into the other laser via the weak optical link 7. The signal from the first laser 1 passes a beam splitter 9 which is placed before the optical isolator 11. The beam splitter divides the optical output into two parts. One part of the output passes via an optical feedback level controller in this instance in the form of an attenuator 8, to a second beam splitter 10 which reflects this signal into the second laser 2 to provide emission stimulation. The other part of the output passes to the optical isolator 11. Likewise, the signal from the second laser 2 passes the beam splitter 10 which is placed before the optical isolator 12. The beam splitter divides the output into two parts. One part of the output passes via the attenuator 8 to the first beam splitter 9 which reflects this signal into the first laser 1 to provide emission stimulation. The other part of the output passes to the optical isolator 12. The attentuation provided by the attenuator 8 is variable and may be varied to vary the amount of injection. A typical figure would be 35–60 dB. This value could be applied, for example, to VCSEL type lasers.

Optionally, the microwave frequency may be synchronized with an external microwave signal. The feedback microwave signal is fed via a 1/n divider 17, for example a ¹⁄₁₂₈ divider, into a phase locked loop filter 18 and, after amplification by an amplifier 19, is combined with an external reference signal source 20.

The bias currents of either or both of the lasers may be varied. The variation in the bias currents of the lasers may be varied simultaneously, for example by varying a variable resistance 23. The variable resistance 23 connects the DC power source to the DC bias inputs of the lasers. In this case the central frequencies of the lasers each change by the same amount so that the difference between the central frequencies remains constant. This means that the heterodyned microwave frequency remains constant. Thus, it is possible to process the optical signals whilst at the same time maintaining the possibility of an, optionally constant, microwave output.

The variable resistance which is provided in the DC input to the second laser 2 allows the bias current of the second laser to be varied relative to the bias current of the first laser. The variable resistance 24 could equally be provided in the DC input line to the first laser 1. If required, a variable resistance could be provided in the input lines of both lasers. The microwave beat signal will change where the effect of a change in the bias current of one or both lasers is to produce a new frequency difference between the central frequencies of the two lasers. The change will produce new sideband frequencies in the laser outputs. The new sideband frequencies will act to injection-lock the lasers to the new frequencies and hence to lock the microwave beat frequency at the new frequency. If a modulating baseband signal is applied to the difference in the bias currents of the two lasers then frequency/phase modulation of the microwave output signal will be achieved.

Figure 4:
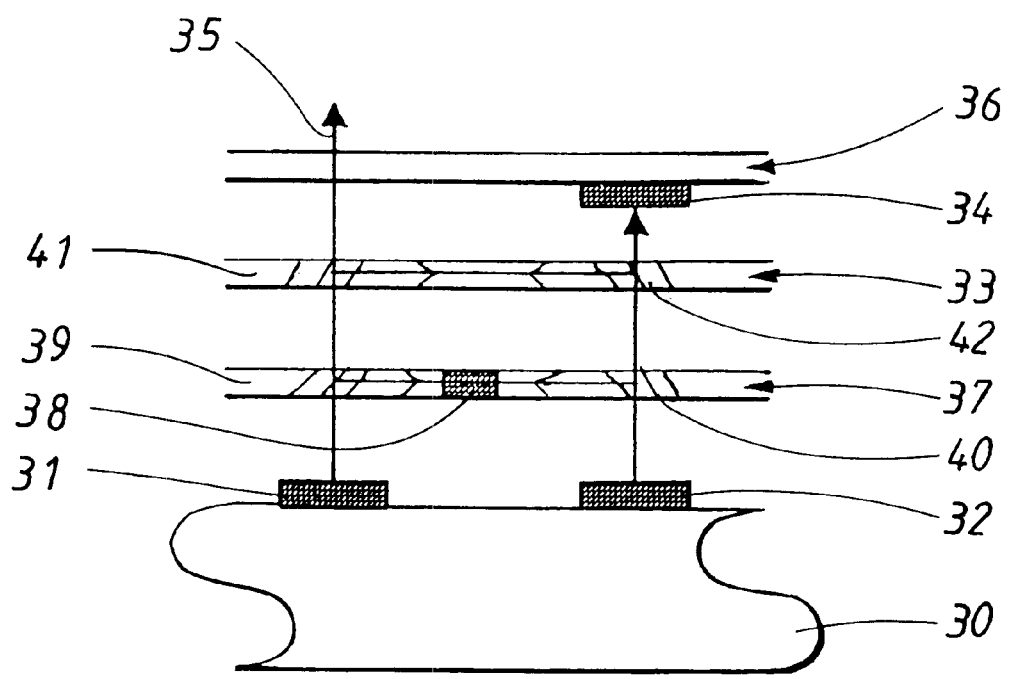
FIG. 4 shows an preferred example embodiment of the invention incorporated into a semiconductor chip.

FIG. 4 shows a preferred embodiment of the invention which employs a pair of VCSEL lasers formed on a semiconductor chip. The apparatus comprises a semiconductor chip substrate 30 on which two VCSEL lasers 31, 32 are formed. Adjacent the substrate is a thin optically transparent film 37. The film is provided with first and second diffraction gratings 39, 40 which function as beam splitters. Within the thin optically transparent film 37, or in optical communication with the film 37, is an optical feedback level controller in the form of an attenuator 38. Adjacent the optically transparent film 37 is a thin beam combiner film 33. The combiner film 33 acts to combine the beams from the two lasers. Adjacent the combiner film 33 is a further substrate 36 which includes a photodiode 34. The photodiode 34 may be connected to microwave circuitry. The combiner film 33 includes third and fourth diffraction gratings 41, 42. The third diffraction grating splits the output from the first laser into a first part which is directed along the thin film 33 to the fourth diffraction grating 42 and a second part which passes through the film as part of an optical output. The fourth diffraction grating 42 splits the beam from the second laser into a first part which is directed along the thin film 33 to the third diffraction grating 41 and a part which passes through the film as part of an optical output. The third diffraction grating 41 deflects the part of the output of the second laser coming from the fourth diffraction grating 42 in the same direction as the output from the first laser to produce a combined optical output 35. The fourth diffraction grating 42 deflects the part to the output of the first laser coming from the third diffraction grating 41 in the same direction as the output from the second laser so as to produce a combined optical output. The combined optical output from the fourth diffraction grating is received by the photodiode 34 on the substrate 36. The photodiode 34 produces an electric signal corresponding to the beat frequencies between the output signals of the first and second lasers. The output from the photodiode may be fed back into the first and second lasers in the same manner as already described with respect to the embodiment depicted in FIG. 3.

In operation, the second laser forms an external cavity to the first laser. The VCSEL laser has an internal cavity formed between a pair of Distributed Bragg Reflectors.

One of the Distributed Bragg Reflectors of the second laser form an external mirror for the first laser. Correspondingly, one of the Distributed Bragg Reflectors of the first laser forms an external mirror for the second laser. If the lasers are outside their locking ranges, then each laser acts as a passive mirror to the other mirror. Optionally, a polarizer may be provided in the optical path between the lasers to stabilize the polarization of the lasers, in particular in the case that the lasers do not have stable polarization.

The optical length of the external cavity may be varied by changing the refractive index of the optically transparent film 37 through which the optical signal is passing. The optical length may be varied in any suitable manner which may include heating or applying an electric field to an electro-optical material of the type whose refractive index depends upon the strength of an applied electric field.

In the above description reference is made to a VCSEL laser operating as a single mode laser. A VCSEL laser may also operate as a multimode laser. In multimode operation a spatial filter may be provided in the external cavity to select the desired mode. The spatial filter acts to select the mode by virtue of its cross-section shape.

Although the invention has been described above with respect to two lasers in parallel it may also be applied to three or more lasers in parallel, each tuned to a different central frequency. In this case the photodetector is arranged to provide two or more feedback signals. Each feedback signal may be passed via a separate band pass filter which selects a different frequency to modulate two or more of the lasers. In this manner microwave output signals at two or more wavelengths may be achieved. Normally, the apparatus is arranged such that the microwave outputs are separated by at least 1 GHz so as to avoid cross-interference, e.g. mutual phase noise. Alternatively the apparatus may be arranged such that the output signals are closer together so that wideband microwave noise may be produced.

The above embodiments of the invention have been described with respect to generating microwaves, i.e. electomagnetic waves with frequencies in the range 1 to 300 Gigahertz. However, with appropriate choice of components they may equally be applied to the production of other frequencies.

What is claimed is:

1. A method of generating a frequency tunable electromagnetic signal, comprising:

heterodyning at least a part of the optical output of two lasers, wherein at least one laser is frequency-tunable;

each laser generating an optical output signal with a central frequency, which when heterodyned with the central frequency of the other laser produces at least one beat frequency, modulating the outputs of the lasers by one or more of the beat frequencies to produce one or more sidebands to the central frequencies, and optically injection- locking each laser to a sideband of the other laser.

2. A method according to claim 1, further comprising:

combining at least a part of the optical outputs of each of the lasers, and extracting from the combined signal at least one beat frequency signal as an electrical signal.

3. A method according to claim 2, wherein the extracting includes filtering the extracted signal to allow only one beat frequency to pass.

4. A method according to claim 2, further comprising:

feeding a part of the electrical beat frequency signal extracted from the combined signal into an output for the beat frequency signal or signals.

5. A method according to claim 3, further comprising:

dividing the combined optical signal prior to extracting the beat frequency, and outputting a part of the divided signal as an optical output signal.

6. A method according to claim 1, further comprising:

providing a reference signal which modulates the output of each of said lasers.

7. A method according to claim 1, further comprising:

changing the central frequencies of the lasers simultaneously and by a substantially equal amount so as to maintain the same beat frequency or frequencies.

8. A method according to claim 1, further comprising:

changing the difference in the central frequencies of the lasers so as to change the beat frequency or frequencies.

9. A method according to claim 1, further comprising:

generating at least one of the beat frequencies in the range of 1 to 300 Gigahertz.

10. An apparatus for generating a frequency tunable electromagnetic signal, comprising:

two lasers of which at least one laser is frequency-tunable;

a combiner for producing a combined signal from the optical outputs of the lasers;

a photodetector for extracting from the combined signal one or more beat frequency signals produced by a difference in the optical central frequencies of the lasers;

a modulation arrangement for modulating the output of the lasers using at least one of the beat frequency signals to produce one or more sidebands to the central frequencies; and an optical coupler for optically injection-locking each laser to a sideband of the central frequency of the other laser by optically connecting a portion of the output of each of the two lasers to the other of the two lasers.

11. An apparatus according to claim 10, further comprising:

an output arrangement for outputting an optical signal arranged to provide an output for one or more of the beat frequency signals.

12. An apparatus according to claim 10, further comprising:
a frequency adjuster for varying the central frequency of one of the lasers relative to the central frequency of the other laser.

13. An apparatus according to claim 10, further comprising:
a frequency adjuster for simultaneously varying the central frequencies of both lasers by a substantially equal amount.

14. An apparatus according to claim 10, further comprising
a power divider for dividing out a part of the combined optical signal of the lasers before the signal is fed into the means for extracting beat frequency signals.

15. An apparatus according to claim 10, wherein the optical coupler includes a beam splitter coupled to the optical output of each laser and an attenutator optically connecting the beam splitters.

16. An apparatus according to claim 10, wherein the lasers are vertical cavity surface emitting lasers arranged on a semiconductor chip.

17. An apparatus according to claim 16, wherein the optical coupler includes a thin, optically-transparent film optically connected to the optical outputs of each laser.

18. An apparatus according to claim 16, wherein the combiner includes a thin film beam combiner.

19. An apparatus according to any of claims 10, wherein the apparatus is arranged to produce at least one beat frequency in the range 1 to 300 Gigahertz.

* * * * *